(12) United States Patent
Hara et al.

(10) Patent No.: US 9,334,417 B2
(45) Date of Patent: May 10, 2016

(54) COATING COMPOSITION AND METHOD FOR PRODUCING COATING FILM

(71) Applicant: ASAHI GLASS COMPANY, LIMITED, Chiyoda-ku (JP)

(72) Inventors: Yuji Hara, Chiyoda-ku (JP); Kouichi Sasaki, Chiyoda-ku (JP); Sho Masuda, Chiyoda-ku (JP)

(73) Assignee: Asahi Glass Company, Limited, Chiyoda-ku (JP)

( * ) Notice: Subject to any disclaimer, the term of this patent is extended or adjusted under 35 U.S.C. 154(b) by 0 days.

(21) Appl. No.: 13/758,599

(22) Filed: Feb. 4, 2013

(65) Prior Publication Data
US 2013/0149454 A1    Jun. 13, 2013

Related U.S. Application Data

(63) Continuation of application No. PCT/JP2011/067372, filed on Jul. 28, 2011.

(30) Foreign Application Priority Data

Aug. 3, 2010 (JP) ................. 2010-174560

(51) Int. Cl.
| | | |
|---|---|---|
| C09D 127/12 | (2006.01) | |
| C09D 127/04 | (2006.01) | |
| C09C 1/40 | (2006.01) | |
| C09D 7/12 | (2006.01) | |
| H01L 31/0216 | (2014.01) | |
| C09C 1/64 | (2006.01) | |
| C09D 5/38 | (2006.01) | |
| H01L 31/049 | (2014.01) | |
| C08J 7/04 | (2006.01) | |
| C08K 7/06 | (2006.01) | |
| C08K 3/08 | (2006.01) | |

(52) U.S. Cl.
CPC ............... *C09D 127/12* (2013.01); *C08J 7/047* (2013.01); *C09C 1/40* (2013.01); *C09C 1/64* (2013.01); *C09C 1/644* (2013.01); *C09D 5/38* (2013.01); *C09D 7/1216* (2013.01); *C09D 127/04* (2013.01); *H01L 31/02167* (2013.01); *H01L 31/049* (2014.12); *C08J 2323/12* (2013.01); *C08J 2427/12* (2013.01); *C08K 7/06* (2013.01); *C08K 2003/0812* (2013.01); *Y02E 10/50* (2013.01)

(58) Field of Classification Search
CPC .. C09D 127/12; C09D 127/04; C09D 201/00; C09D 5/38; C09D 7/1216; C08K 7/00; C08K 2003/0812; C08K 7/06; C09C 1/40; C09C 1/64; C09C 1/644; H01L 31/02167; H01L 31/049; Y02E 10/50
USPC .......................................................... 106/400
See application file for complete search history.

(56) References Cited

U.S. PATENT DOCUMENTS

| | | | | |
|---|---|---|---|---|
| 3,389,105 A | * | 6/1968 | Bolger ................. | B22F 9/04 106/403 |
| 4,558,075 A | * | 12/1985 | Suss et al. ................ | 523/216 |
| 4,971,841 A | * | 11/1990 | Panush et al. ............ | 427/407.1 |
| 2004/0013610 A1 | * | 1/2004 | Dournel ..................... | 424/45 |
| 2006/0199898 A1 | * | 9/2006 | Funaki et al. .............. | 524/544 |

FOREIGN PATENT DOCUMENTS

| | | | | |
|---|---|---|---|---|
| EP | 2336253 | * | 6/2011 | ........... C09D 127/12 |
| JP | 63-101463 | | 5/1988 | |
| JP | 63-234072 | | 9/1988 | |
| JP | 6-100834 | | 4/1994 | |
| JP | 11-128828 | | 5/1999 | |
| JP | 2001-240808 | | 9/2001 | |
| JP | 2007-35694 | | 2/2007 | |
| WO | 2010-041688 | | 4/2010 | |
| WO | WO/2010/041688 | * | 4/2010 | ........... C09D 127/12 |

OTHER PUBLICATIONS

International Search Report issued Aug. 30, 2011 in PCT/JP2011/067372 filed Jul. 28, 2011.

* cited by examiner

*Primary Examiner* — Shuangyi Abu Ali
(74) *Attorney, Agent, or Firm* — Oblon, McClelland, Maier & Neustadt, L.L.P.

(57) ABSTRACT

To provide a coating composition with which a coating film excellent in the moisture resistance, the weather resistance and the corrosion resistance can be formed by a single application and removal of an organic solvent, a method for producing such a coating film, and a coated article having a coating film obtainable by it.
A coating composition comprising an organic solvent, a coating resin soluble or dispersible in the organic solvent, and a leafing aluminum pigment, wherein the surface tension of the organic solvent at 20° C. is from 10 to 22 mN/m, and a method for producing a coating film, which comprises applying the coating composition to a substrate, and removing the organic solvent in the coating composition.

11 Claims, No Drawings

COATING COMPOSITION AND METHOD FOR PRODUCING COATING FILM

This application is a continuation of PCT Application No. PCT/JP2011/067372 filed on Jul. 28, 2011, which is based upon and claims the benefit of priority from Japanese Patent Application No. 2010-174560 filed on Aug. 3, 2010. The contents of those applications are incorporated herein by reference in its entirety.

TECHNICAL FIELD

The present invention relates to a coating composition and a method for producing a coating film using it.

BACKGROUND ART

There are various functions of coating films formed from coating compositions, and with respect to functions to protect substrates covered with coating films from external factors, such as the mechanical strength, the weather resistance, the water/moisture resistance and the electrical insulating properties, their properties required are becoming severe in recent years.

Particularly, with respect to the moisture resistance to protect substrates from moisture, properties required in the field of backsheets for solar cell modules and the like are becoming severe.

A backsheet for a solar cell module is required to have moisture resistance, and as a backsheet for a solar cell module having moisture resistance, one having a cured coating film of a curable functional group-containing fluorinated polymer coating formed only on one side of a water impermeable sheet has been proposed (Patent Document 1). Such a backsheet for a solar cell module can be used for a crystalline silicon solar cell, but cannot be used for an element of which the efficiency decrease by moisture is remarkable, such as an organic dye sensitized element.

As another method to impart moisture resistance to a coating film, a method of forming a metal layer considered to have high moisture resistance between a substrate and the coating film may also be considered, however, in such a case, a plurality of steps including a step of forming a metal layer on the substrate and a step of further forming the coating film thereon are required, thus leading to complicated production.

On the other hand, heretofore, a coating composition having a scaly leafing aluminum pigment subjected to surface treatment with stearic acid or the like blended has been used. It has been known that by such a coating composition, a coating film to be formed on a substrate is a coating film having a layer in which aluminum pigment particles are aligned in parallel with the substrate at the surface layer portion (vapor phase side) of the coating film regardless of the coating method. By the coating film having a layer in which aluminum pigment particles are aligned, the moisture resistance of the coating film will be improved. However, as the layer in which aluminum pigment particles are aligned is at the surface layer portion of the coating film, a further protective layer will be required to prevent deterioration of aluminum by corrosion or the like.

Further, it has also been known to blend a non-leafing aluminum pigment not subjected to surface treatment with stearic acid or the like with the coating composition. In such a case, although non-leafing aluminum particles will be aligned in parallel with the substrate in the coating film, they are irregularly present in the coating film as different from the leafing aluminum pigment, and accordingly the moisture resistance of the coating film will not be improved. Accordingly, it is necessary to blend a larger amount of the aluminum pigment with the coating composition so as to increase the moisture resistance of the coating film by blending the non-leafing aluminum pigment. However, if a certain amount or more of the aluminum pigment is blended, the absolute amount of the aluminum pigment in the coating film formed on the substrate will be increased, whereby embedding of the aluminum pigment in the coating film components tends to be insufficient, whereby the stability of the aluminum pigment and the strength of the coating film may not be maintained.

PRIOR ART DOCUMENT

Patent Document

Patent Document 1: JP-A-2007-35694

DISCLOSURE OF INVENTION

Technical Problem

The object of the present invention is to provide a coating composition with which a coating film excellent in the moisture resistance, the weather resistance and the corrosion resistance can be formed by a single application and removal of an organic solvent, and a method for producing such a coating film.

Solution to Problem

The present invention provides the following coating composition and method for producing a coating film.

[1] A coating composition comprising an organic solvent, a coating resin soluble or dispersible in the organic solvent, and a leafing aluminum pigment, wherein the surface tension of the organic solvent at 20° C. is from 10 to 22 mN/m.

[2] The coating composition according to [1], wherein the leafing aluminum pigment is contained in a proportion of from 5 to 25 parts by mass per 100 parts by mass of the coating resin.

[3] The coating composition according to [1], which further contains a curing agent.

[4] The coating composition according to [3], wherein the leafing aluminum pigment is contained in a proportion of from 5 to 25 parts by mass per 100 parts by mass of the total amount of the coating resin and the curing agent.

[5] The coating composition according to any one of [1] to [4], wherein the content of the organic solvent is from 50 to 90 mass % in the total mass of the coating composition.

[6] The coating composition according to any one of [1] to [5], wherein the coating resin is a coating resin comprising a curable resin.

[7] The coating composition according to any one of [1] to [6], wherein the coating resin is a fluororesin.

[8] The coating composition according to any one of [1] to [7], which further contains at least one member selected from the group consisting of a curing catalyst, an ultraviolet absorber and a pigment.

[9] The coating composition according to any one of [1] to [8], wherein the coating resin is a fluorinated copolymer having crosslinkable groups.

[10] The coating composition according to any one of [1] to [9], wherein the coating resin is a chlorotrifluoroethylene/hydroxyalkyl vinyl ether copolymer, a chlorotrifluoroethylene/hydroxyalkyl vinyl ether/alkyl vinyl ether copolymer, or a chlorotrifluoroethylene/hydroxyalkyl vinyl ether/vinyl carboxylate copolymer.

[11] The coating composition according to any one of [1] to [10], wherein the organic solvent is 3,3-dichloro-1,1,1,2,2-pentafluoropropane, 1,3-dichloro-1,1,2,2,3-pentafluoropropane, 1,1,1,3,3-pentafluorobutane, pentafluoropropanol, hexafluoroisopropanol or a mixture of at least two of them.

[12] A method for producing a coating film, which comprises applying the coating composition as defined in any one of [1] to [11] to a substrate, and removing the organic solvent in the coating composition.

[13] The method for producing a coating film according to [12], wherein the substrate is a resin sheet.

[14] The method for producing a coating film according to [12] or [13], wherein a layer having the leafing aluminum pigment aggregated is formed in the interior of the coating film.

Advantageous Effects of Invention

According to the coating composition of the present invention, a coating film excellent in the moisture resistance, the weather resistance and the corrosion resistance can be formed by a single application and removal of an organic solvent. Further, according to the present invention, a coated article having a coating film excellent in the moisture resistance, the weather resistance and the corrosion resistance can be obtained.

DESCRIPTION OF EMBODIMENTS

Now, the embodiments of the present invention will be described. However, the present invention is by no means restricted to the following embodiments.

In this specification, unless otherwise specified, "%" means "mass %". "Polymerized units" in a resin will sometimes be referred to as "units", and "polymerized units formed by a monomer" as "units of a monomer". Further, "(meth)acrylic acid" means acrylic acid or methacrylic acid.

[Coating Composition]

The coating composition of the present invention is a coating composition comprising an organic solvent, a coating resin soluble or dispersible in the organic solvent, and a leafing aluminum pigment (hereinafter sometimes referred to as "aluminum pigment"), wherein the surface tension of the organic solvent at 20° C. is from 10 to 22 mN/m.

According to prior art, with a coating composition containing a leafing aluminum pigment, by the surface tension at the time of forming the coating film, aluminum pigment particles float on the coating film surface and overlap and are aligned in parallel with the substrate, whereby a layer of the aluminum pigment is formed on the coating film surface (vapor phase side).

On the other hand, with respect to the coating composition of the present invention, by selecting, as the organic solvent to be blended in the coating composition together with the leafing aluminum pigment, an organic solvent having a surface tension at 20° C. of from 10 to 22 nM/m, the position of the layer in which the leafing aluminum pigment particles are aligned in parallel in the coating film can be shifted from the surface of the coating film to the coating film interior. Accordingly, in a case where the coating composition of the present invention is used, as a layer in which the aluminum pigment particles are aggregated in the coating film interior is formed by a single application and removal of an organic solvent, a coating film excellent in the moisture resistance, the weather resistance and the corrosion resistance can be formed. Further, as the aluminum pigment is present in the coating film interior, it is not necessary to provide a protective layer to prevent corrosion of the aluminum pigment. Here, the layer in which the aluminum pigment particles are aggregated does not necessarily mean formation of a continuous phase, so long as the aluminum pigment particles are assembled in a portion with a certain distance from the coating film surface and in the coating film interior.

(1) Coating Resin

The coating resin contained in the coating composition of the present invention is not particularly limited so long as it is soluble or dispersible in the organic solvent blended in the coating composition.

Such a coating resin may be a non-curable resin or a curable resin. In a case where the coating composition contains a curable resin as the coating resin, it may further contain a curing agent.

The non-curable resin is a resin which has no crosslinkable groups and will not undergo curing by the crosslinking reaction. The non-curable resin is preferably a fluorinated non-curable resin in view of favorable weather resistance.

The non-curable resin is preferably a polyacrylic resin such as poly((meth)acrylate), an alkyd resin, a polyester resin or a non-crosslinkable fluororesin, and from the viewpoint of the weather resistance, it is more preferably a polyacrylic resin, a polyester resin or a non-crosslinkable fluororesin, most preferably a non-crosslinkable fluororesin.

The non-crosslinkable fluororesin is preferably a homopolymer or a copolymer having, as polymerized units, polymerized units formed from a monomer having a fluorine atom and having no crosslinkable group.

The monomer having a fluorine atom and having no crosslinkable group is preferably a fluoroolefin such as tetrafluoroethylene (TFE), hexafluoropropylene (HFP), chlorotrifluoroethylene (CTFE), vinylidene fluoride (VdF) or vinyl fluoride (VF), or an olefin having a fluoroalkyl group such as a perfluoro(alkyl vinyl ether) (PAVE) or a monomer (hereinafter sometimes referred to as "monomer having a fluoroalkyl group") having a fluoroalkyl group and a polymerizable unsaturated group connected by an ether bond or an ester bond.

The non-crosslinkable fluororesin may, specifically, be preferably a resin comprising a VdF homopolymer, a resin comprising a copolymer of TFE/unsaturated monomer having no crosslinkable group, a resin comprising a copolymer of CTFE/unsaturated monomer having no crosslinkable group, a resin comprising a copolymer of VdF/unsaturated monomer having no crosslinkable group, a resin comprising a HFP/TFENdF copolymer or the like, and from the viewpoint of availability and adhesion, it is more preferably a resin comprising a VdF homopolymer, a resin comprising a copolymer of TFE/unsaturated monomer having no crosslinkable group, or a resin comprising a copolymer of CTFE/unsaturated monomer having no crosslinkable group.

The curable resin is a resin which has crosslinkable groups in the resin and is cured by a crosslinking reaction.

The crosslinkable groups which the curable resin has may be hydroxy groups, carboxy groups, epoxy groups, alkoxysilyl groups, carbonyl groups, amino groups, isocyanate groups or oxetanyl groups, and from the viewpoint of curing properties at low temperature, they are preferably hydroxy groups, carboxy groups, epoxy groups, alkoxysilyl groups, amino groups or isocyanate groups. The crosslinkable group in the unsaturated monomer having no crosslinkable group also means the same group.

The curable resin is preferably an epoxy resin such as a bisphenol A (F), diglycidyl ether addition polymer or a novolac epoxy resin; a crosslinkable polyacrylic resin such as a (meth)acrylic acid polymer having crosslinkable groups, or a (meth)acrylate polymer having crosslinkable groups; an alkyd resin such as a medium-oil alkyd resin or a short-oil alkyd resin; a crosslinkable polyester resin such as a polycondensate of a polyol and a dibasic acid having a hydroxy group, a carboxy group or both of them; a silicone resin such as dimethylpolysiloxane or an epoxy-modified polysilicon resin, or a crosslinkable fluororesin, and from the viewpoint of the weather resistance, it is more preferably a crosslinkable polyacrylic resin, a crosslinkable polyester resin or a crosslinkable fluororesin, and most preferably a crosslinkable fluororesin.

The crosslinkable fluororesin is preferably a resin comprising a fluorinated copolymer having crosslinkable groups.

The fluorinated copolymer having crosslinkable groups (hereinafter sometimes referred to as "crosslinkable fluorinated copolymer") is a copolymer having fluorine atoms and crosslinkable groups. Such a copolymer preferably has polymerized units having a fluorine atom and polymerized units having a crosslinkable group. Each polymerized unit having a fluorine atom is preferably a polymerized unit formed by polymerization of a fluoroolefin, and each polymerized unit having a crosslinkable group is preferably a unit formed by polymerization of a monomer having a crosslinkable group.

Monomer Having Fluorine Atom:

As a monomer having a fluorine atom, a fluoromonomer which is commonly used as a fluororesin material may be mentioned without any particular restriction. Specifically, the above fluoroolefin or olefin having a fluoroalkyl group is preferred. Among them, TFE, HFP, CTFE, VdF or VF is preferred, and TFE or CTFE is particularly preferred. Such monomers may be used alone or in combination of two or more.

Monomer Having Crosslinkable Group:

As a monomer having a crosslinkable group, a monomer having a crosslinkable group and a polymerizable unsaturated group capable of being copolymerized with the above monomer having a fluorine atom may be used without any particular restriction. The crosslinkable group in the monomer having a crosslinkable group is preferably a hydroxy group, a carboxy group, an amino group, an epoxy group, a hydrolyzable silyl group, a carbonyl group, a cyano group, an isocyanate group or the like. Among them, from the viewpoint of the crosslinkability, the availability and the easiness of introduction to a polymer, it is preferably a hydroxy group, a carboxy group, a hydrolyzable silyl group, an amino group, an epoxy group or a carbonyl group, more preferably a hydroxy group, a carboxy group or an epoxy group. Such monomers having a crosslinkable group may be used alone or in combination of two or more.

As a monomer having such a crosslinkable group, specifically, the following may be mentioned, but the monomer is not limited thereto.

A monomer having a hydroxy group is a monomer having a hydroxy group and a polymerizable unsaturated group. The monomer having a hydroxy group is preferably, for example, a hydroxy group-containing vinyl ether such as 2-hydroxyethyl vinyl ether, 3-hydroxypropyl vinyl ether, 2-hydroxypropyl vinyl ether, 2-hydroxy-2-methylpropyl vinyl ether, 4-hydroxybutyl vinyl ether, 4-hydroxy-2-methylbutyl vinyl ether, or 5-hydroxypentyl vinyl ether-10-hydroxyhexyl vinyl ether; or a hydroxy group-containing allyl ether such as 2-hydroxyethyl allyl ether, 4-hydroxybutyl allyl ether or glycerol monoallyl ether. Among them, a hydroxy group-containing vinyl ether, particularly 4-hydroxybutyl vinyl ether or 2-hydroxyethyl vinyl ether is more preferred in view of the availability, the polymerizability and the crosslinkability of the crosslinkable group.

As another monomer having a hydroxy group, a hydroxyalkyl ester of (meth)acrylic acid such as 2-hydroxyethyl acrylate or 2-hydroxyethyl methacrylate may, for example, be mentioned. The monomers having a hydroxy group may be used alone or in combination of two or more.

A monomer having a carboxy group is a monomer having a carboxy group and a polymerizable unsaturated group. As an acid anhydride of an unsaturated dicarboxylic acid is easily converted to a monomer having a carboxy group, in this specification, an unsaturated dicarboxylic anhydride is regarded as a monomer equivalent to the monomer having a carboxy group.

The monomer having a carboxy group is preferably an unsaturated monocarboxylic acid such as acrylic acid, methacrylic acid, vinylacetic acid, crotonic acid, cinnamic acid, undecylenic acid, 3-allyloxypropionic acid, 3-(2-allyloxyethoxycarbonyl)propionic acid or vinyl phthalate; an unsaturated dicarboxylic acid such as maleic acid, fumaric acid or itaconic acid; an unsaturated dicarboxylic monoester such as itaconic monoester, maleic monoester or fumaric monoester; or an unsaturated dicarboxylic anhydride such as maleic anhydride. In addition, a vinyl ether or an allyl ether of a polyhydric carboxylic acid such as vinyl pyromellitate or an allyl ether may, for example, be mentioned. Among them, crotonic acid, undecylenic acid, maleic acid, itaconic acid or the like is preferred in view of excellent availability, polymerizability and crosslinkability. The monomers having a carboxy group may be used alone or in combination of two or more.

As a method for introducing carboxy groups to the crosslinkable fluorinated copolymer, in addition to the above method of copolymerizing a monomer having a carboxy group, a method of copolymerizing the above monomer having a hydroxy group, and reacting the introduced hydroxy group with an acid anhydride may be mentioned.

On that occasion, preferred as the monomer having a hydroxy group is the same as the above monomer having a hydroxy group. As a preferred acid anhydride, succinic anhydride, hexahydrophthalic anhydride, methylbicyclo[2.2.1]heptane-2,3-dicarboxylic anhydride, bicyclo[2.2.1]heptane-2,3-dicarboxylic anhydride or 4-methylhexahydrophthalic anhydride may be mentioned.

A monomer having an amino group is a monomer having an amino group and a polymerizable unsaturated group. The monomer having an amino group is preferably, for example, an aminoalkyl vinyl ether represented by $CH_2=CH-O-(CH_2)_x-NH_2$ (x=0 to 10); an aminoalkyl allyl ether represented by $CH_2=CHCH_2-O-(CH_2)_x-NH_2$ (x=1 to 10); a vinyl aminocarboxylate represented by $CH_2=CH-O-CO(CH_2)_x-NH_2$ (x=1 to 10); an allyl aminocarboxylate represented by $CH_2=CHCH_2-O-CO(CH_2)_x-NH_2$ (x=1 to 10), or a monomer having an amino group having at least one hydrogen at a moiety represented by $-(CH_2)_x-$ in the above monomer substituted by an alkyl group. In addition, aminomethylstyrene, vinylamine, acrylamide, vinylacetamide, vinylformamide or the like may be mentioned. Among them, an aminoalkyl vinyl ether, an aminoalkyl allyl ether, a vinyl aminocarboxylate or an allyl aminocarboxylate is more preferred. The monomers having an amino group may be used alone or in combination of two or more.

A monomer having an epoxy group is a monomer having an epoxy group and a polymerizable unsaturated group. The epoxy group in the monomer having an epoxy group is preferably a glycidyl group. The monomer having an epoxy group is preferably glycidyl vinyl ether, glycidyl allyl ether, glycidyl(meth)acrylate or the like. The monomers having an epoxy group may be used alone or in combination of two or more.

A monomer having a hydrolyzable silyl group is a monomer having a hydrolyzable silyl group and a polymerizable unsaturated group. The monomer having a hydrolyzable silyl group may, for example, be a (meth)acrylate such as $CH_2=CHCO_2(CH_2)_3Si(OCH_3)_3$, $CH_2=CHCO_2(CH_2)_3Si(OC_2H_5)_3$, $CH_2=C(CH_3)CO_2(CH_2)_3Si(OCH_3)_3$, $CH_2=C(CH_3)CO_2(CH_2)_3Si(OC_2H_5)_3$, $CH_2=CHCO_2(CH_2)_3SiCH_3(OC_2H_5)_2$, $CH_2=C(CH_3)CO_2(CH_2)_3SiC_2H_5(OCH_3)_2$, $CH_2=C(CH_3)CO_2(CH_2)_3Si(CH_3)_2(OC_2H_5)$, $CH_2=C(CH_3)CO_2(CH_2)_3Si(CH_3)_2OH$, $CH_2=CH(CH_2)_3Si(OCOCH_3)_3$, $CH_2=C(CH_3)CO_2(CH_2)_3SiC_2H_5(OCOCH_3)_2$, $CH_2=C(CH_3)CO_2(CH_2)_3SiCH_3(N(CH_3)COCH_3)_2$, $CH_2=CHCO_2(CH_2)_3SiCH_3[ON(CH_3)C_2H_5]_2$, or $CH_2=C(CH_3)CO_2(CH_2)_3SiC_6H_5[ON(CH_3)C_2H_5]_2$; a vinylsilane such as $CH_2=CHSi[ON=C(CH_3)(C_2H_5)]_3$, $CH_2=CHSi(OCH_3)_3$, $CH_2=CHSi(OC_2H_5)_3$, $CH_2=CHSiCH_3(OCH_3)_2$, $CH_2=CHSi(OCOCH_3)_3$, $CH_2=CHSi(CH_3)_2(OC_2H_5)_3$, $CH_2=CHSi(CH_3)_2SiCH_3(OCH_3)_2$, $CH_2=CHSiC_2H_5(OCOCH_3)_2$, $CH_2=CHSiCH_3[ON(CH_3)C_2H_5]_2$ vinyltrichlorosilane or a partial hydrolyzate thereof; or a vinyl ether such as trimethoxysilylethyl vinyl ether, triethoxysilylethyl vinyl ether, trimethoxysilylbutyl vinyl ether, methyldimethoxysilylethyl vinyl ether, trimethoxysilylpropyl vinyl ether or triethoxysilylpropyl vinyl ether. The monomers having a hydrolyzable silyl group may be used alone or in combination of two or more.

The crosslinkable fluorinated copolymer to be used in the present invention contains units of the monomer having a fluorine atom and units of the monomer having a crosslinkable group, and further, as the case requires, may optionally contain polymerized units of a monomer containing neither fluorine atom nor crosslinkable group (hereinafter referred to as "another monomer").

Such another monomer is preferably an olefin or a monomer having an alkyl group and a polymerizable unsaturated group connected by an ether bond or an ester bond.

In the following, the crosslinkable fluorinated copolymers to be used in the present invention are classified based on the polymerized units of the monomer having a fluorine atom contained, and a combination of polymerized units constituting the crosslinkable fluorinated copolymer in each classification are exemplified below.

Here, the crosslinkable fluorinated copolymers include a resin type polymer having a definite melting point, an elastomeric polymer having rubber elasticity, and a thermoplastic elastomeric polymer intermediate between them.

The crosslinkable fluorinated copolymer to be used for the production method of the present invention has units of the monomer having a fluorine atom. The monomer having a fluorine atom is preferably a monomer such as TFE, HFP, perfluoro(alkyl vinyl ether) (PAVE), a monomer having a fluoroalkyl group, VdF, CTFE, VF or fluorovinyl ether, or a combination of such monomers. Among them, TFE, CTFE or VdF is preferred, and TFE or CTFE is more preferred.

As a monomer other than the monomer having a fluorine atom, the above monomer having a crosslinkable group and other monomers may be used without any particular restriction. On that occasion, a preferred monomer is the same as the preferred monomer described for the monomer having a crosslinkable group and other monomers.

Crosslinkable Fluorinated Copolymer Composed Mainly of Units of TFE:

As a crosslinkable fluorinated copolymer composed mainly of units of TFE (hereinafter sometimes referred to as "crosslinkable TFE copolymer"), for example, a TFE/hydroxyalkyl vinyl ether copolymer, a TFE/hydroxyalkyl vinyl ether/alkyl vinyl ether copolymer, a TFE/hydroxyalkyl vinyl ether/vinyl carboxylate copolymer, or a copolymer of such a combination of monomers with one or more other monomers, is preferred.

More specifically, it is preferably a TFE/hydroxybutyl vinyl ether/isobutylene copolymer, a TFE/hydroxybutyl vinyl ether/vinyl versatate copolymer, a TFENdF/hydroxybutyl vinyl ether copolymer or a copolymer of such a combination of monomers with another monomer. Among them, it is more preferably a TFE/hydroxybutyl vinyl ether/isobutylene copolymer, a TFE/hydroxybutyl vinyl ether/vinyl versate copolymer or a copolymer of such a combination of monomers with one or more other monomers.

A coating material containing the crosslinkable fluorinated copolymer composed mainly of units of TFE among the crosslinkable TFE copolymers may, for example, be commercially available products such as ZEFFLE GK (tradename) series manufactured by DAIKIN INDUSTRIES, LTD., and they may be used in the present invention.

Crosslinkable Fluorinated Copolymer Composed Mainly of Units of CTFE:

As a crosslinkable fluorinated copolymer composed mainly of units of CTFE (hereinafter sometimes referred to as "crosslinkable CTFE copolymer"), for example, a CTFE/hydroxyalkyl vinyl ether copolymer, a CTFE/hydroxyalkyl vinyl ether/alkyl vinyl ether copolymer, a CTFE/hydroxyalkyl vinyl ether/vinyl carboxylate copolymer, or a copolymer of such a combination of monomers with one or more other monomers, is preferred.

More specifically, it is more preferably a CTFE/hydroxybutyl vinyl ether copolymer, a CTFE/hydroxyethyl vinyl ether copolymer, a CTFE/hydroxybutyl vinyl ether/ethyl vinyl ether copolymer, a CTFE/hydroxybutyl vinyl ether/2-ethylhexyl vinyl ether copolymer, a CTFE/hydroxybutyl vinyl ether/vinyl versatate copolymer, a CTFE/hydroxybutyl vinyl ether/ethyl vinyl ether/cyclohexyl vinyl ether copolymer, or a copolymer of such a combination of monomers with another monomer.

Among them, in view of favorable solubility or dispersibility in a medium and favorable flexibility of a coating film layer obtainable by curing, it is more preferably a CTFE/hydroxybutyl vinyl ether/ethyl vinyl ether copolymer, a CTFE/hydroxybutyl vinyl ether/2-ethylhexyl vinyl ether copolymer, a CTFE/hydroxybutyl vinyl ether/vinyl versatate copolymer, a CTFE/hydroxybutyl vinyl ether/ethyl vinyl ether/cyclohexyl vinyl ether copolymer, or a copolymer of such a combination of monomers with one or more other monomers.

The crosslinkable CTFE copolymer composed mainly of units of CTFE is preferred in view of the copolymerizability at the time of polymerization, the pigment dispersibility when formed into a coating material, and excellent weather resistance, chemical resistance and moisture resistance of a coating film layer obtainable by curing.

A coating material containing the crosslinkable CTFE copolymer may, for example, be commercially available products such as Lumiflon (tradename) manufactured by Asahi Glass Company, Limited, FLUONATE (tradename) manufactured by DIC Corporation and CEFRAL COAT (tradename) manufactured by Central Glass Co., Ltd., and they may be used in the present invention. Crosslinkable fluorinated copolymer composed mainly of units of VdF:

As specific examples of a crosslinkable fluorinated copolymer composed mainly of units of VdF, a VdF/TFE/hydroxybutyl vinyl ether copolymer and a copolymer of such a combination of monomers with one or more other monomers may be mentioned.

In a case where the crosslinkable fluorinated copolymer is used as the coating resin to be used in the present invention, it preferably contains units of the monomer having a fluorine atom, units of the monomer having a crosslinkable group and other units. The total content of units of the monomer having a fluorine atom in the crosslinkable fluorinated copolymer is preferably from 35 to 65 mol %, more preferably from 40 to 60 mol % to all the units in the crosslinkable fluorinated copolymer. When the content of the units of the monomer having a fluorine atom in the crosslinkable fluorinated copolymer is within the above range, both of the weather resistance and the solubility in the solvent can be satisfied.

Further, the total content of the units of the monomer having a crosslinkable group in the crosslinkable fluorinated copolymer is preferably from 6 to 50 mol %, more preferably from 7 to 40 mol % to all the units in the crosslinkable fluorinated copolymer. When the total content of the units of the monomer having a crosslinkable group in the crosslinkable fluorinated copolymer is at least 6 mol %, the degree of crosslinking sufficient to secure e.g. the hardness of a coating film obtainable by curing the crosslinkable fluorinated copolymer can be secured, and when it is at most 50 mol %, gelation is less likely to occur when the polymer is formed into a solution.

In a case where a coating film is to be obtained not by the crosslinking reaction, the content of the units of the monomer having a crosslinkable group is preferably at least 0.4 mol % to all the units in the crosslinkable fluorinated copolymer. When the content of the units of the monomer having a crosslinkable group is at least 0.4 mol %, sufficient adhesion when formed into a laminate can be secured.

The total content of the units of another monomer in the crosslinkable fluorinated copolymer is preferably at most 45 mol %, more preferably at most 35 mol % to all the units in the crosslinkable fluorinated copolymer.

In a case where the crosslinkable fluorinated copolymer is used as the coating resin in the present invention, it can be obtained by copolymerizing the above respective monomers by a known polymerization method, specifically, a polymerization method such as solution polymerization, emulsion polymerization or suspension polymerization.

With respect to the content of the coating resin in the coating composition of the present invention, the total mass of the coating resin, the leafing aluminum pigment and the curing agent when the coating composition contains the curing agent, is preferably from 10 to 50 mass % to the total mass of the composition from the viewpoint of the coating workability, more preferably from 10 to 40 mass %.

(2) Curing Agent

In a case where the coating resin used in the coating composition of the present invention is a curable resin, the coating composition preferably contains a curing agent. Some curing resins are cured only by drying depending upon the type of the crosslinkable groups. In such a case where the curable resin itself is cured, addition of the curing agent is not necessarily required.

The above curing agent which the coating composition contains as the case requires together with the curable resin, is properly selected depending upon the crosslinkable groups which the curable resin has. In a case where the crosslinkable groups which the curable resin has are hydroxy groups, the curing agent is preferably an isocyanate curing agent, a melamine resin, a silicate compound, an isocyanate group-containing silane compound or the like. Further, in a case where the crosslinkable groups are carboxy groups, it is preferably an amino curing agent or an epoxy curing agent, and in a case where the crosslinkable groups are amino groups, it is preferably a carbonyl group-containing curing agent or an epoxy curing agent, or an acid anhydride curing agent. The addition amount of the curing agent depends on the curing agent to be used, and is preferably from 0.7 to 1.3, more preferably from 0.75 to 1.25 by the proportion to the number of moles of the crosslinkable groups in the curable resin.

(3) Leafing Aluminum Pigment

The leafing aluminum pigment is an aluminum pigment the surface of which is treated with a saturated fatty acid such as stearic acid to adjust the surface tension.

As the leafing aluminum pigment particles are aligned in parallel with the substrate and overlap with one another in the coating film thereby to form a layer, the moisture resistance can be improved with a small amount as compared with a case of using the non-leafing aluminum pigment which will not form a layer.

The leafing aluminum pigment to be used for the coating composition of the present invention, leafing aluminum pigments commonly used for coating material may be used without any particular restriction.

The leafing aluminum pigment preferably has an average particle size of from 5 to 15 μm and an aspect ratio of from 50 to 400, since the degree of overlapping of the aluminum pigment particles tends to be high, whereby a high effect of suppressing the water vapor permeation can be obtained. Here, the average particle size of the leafing aluminum pigment means a 50% value (D50) in the particle size distribution measured by a laser diffraction type particle size distribution measuring apparatus. Further, the aspect ratio is a value obtained by dividing the average particle size by the particle average thickness determined by the formula [4000/water surface covered area $(cm^2/g)$]. The leafing aluminum pigment has such properties that the particles are aligned in parallel with the substrate at the time of forming a coating film due to the volume shrinkage in the coating film thickness direction by volatilization of the organic solvent or the like in the coating composition. Accordingly, the particle size of the aluminum pigment can suitably be selected regardless of the coating film thickness, for example such that an aluminum pigment having an average particle size larger than the thickness of the coating film is used.

Further, the surface tension of the leafing aluminum pigment used is preferably the surface tension of a common leafing aluminum pigment, i.e. from 20 to 30 mN/m at 20° C., more preferably from 22 to 25 mN/m. This surface tension is a value obtained by dropping a liquid, of which the surface tension of its solid is preliminarily measured, on the solid surface, measuring the contact angle and calculating the surface tension by the Young's formula. When the surface tension is within such a range, the leafing aluminum pigment particles tend to be aggregated in the coating film interior thereby to form a layer.

Further, for the coating composition of the present invention, as the leafing aluminum pigment to be blended, commercially available products may be used. Such commercially available products may, for example, be STAPA leafing (tradename, manufactured by ECKART), oil leafing (tradename, manufactured by Showa Aluminum Corporation), aluminum paste leafing type (tradename, manufactured by Asahi Kasei Corp.), leafing aluminum paste (tradename, manufactured by TOYO ALUMINUM K.K.) and BLITZ (leafing) (tradename, manufactured by Benda-Lutz Werke GmbH).

The amount of the leafing aluminum pigment blended in the coating composition of the present invention is preferably from 5 to 25 parts by mass, more preferably from 5 to 21 parts by mass per 100 parts by mass of the coating resin contained in the coating composition (in a case where the coating composition contains a curing agent, the total content of the coating resin and the curing agent), in view of favorable film forming properties and favorable mobility of the leafing aluminum pigment in the coating film.

(4) Organic Solvent

As the organic solvent to be used for the coating composition of the present invention, an organic solvent which is commonly used for coating material, and which has a surface tension at 20° C. of from 10 to 22 mN/m, may be used without any particular restriction. Hereinafter in this specification, unless otherwise specified, the surface tension is a value at 20° C. This surface tension is a measured value by the du Nouy method (ring method).

As the coating composition of the present invention contains the organic solvent having a surface tension within the above range and the leafing aluminum pigment, in the procedure for forming the coating film, the aluminum pigment particles are aligned in parallel and overlap with one another in the coating film interior, whereby a coating film having a layer in which the aluminum pigment particles are aggregated in the coating film interior can be produced.

In a case where a conventional solvent commonly used for coating material is used, the aluminum pigment particles are aggregated on the surface of the coating film. Accordingly, when a layer having the aluminum pigment particles aggregated is to be formed in the coating film interior, it is necessary to further apply the coating material once more on the layer having the aluminum pigment particles aggregated on the surface of the coating film, to form the coating film.

However, according to the coating composition of the present invention, a coating film having a layer having the aluminum pigment particles aggregated in the coating film interior can be produced by single coating film formation. According to tests by the present inventors, the coating film having such a layer having aluminum pigment particles aggregated in the coating film was found to be excellent in the moisture resistance and the stability during the long term use.

If a layer having aluminum pigment particles aggregated is formed on the surface (the atmosphere side) of the coating film, a problem of corrosion of the aluminum pigment will arise. On the other hand, if the layer having aluminum pigment particles aggregated is formed in the vicinity of the boundary between the substrate and the coating film, a problem such as a decrease in the adhesion between the coating film and the substrate will arise.

The upper limit of the surface tension of the organic solvent is 22 mN/m as mentioned above, and is preferably 20 mN/m. Further, the lower limit is 10 mN/m, and is preferably 12 mN/m. When the surface tension of the organic solvent is within such a range, the coating film having a layer having aluminum pigment particles aggregated in the coating film interior can be produced by single coating film formation by using the coating composition of the present invention.

Such an organic solvent may, for example, be specifically HCFC-225ca (3,3-dichloro-1,1,1,2,2-pentafluoropropane (surface tension: 15.8 (hereinafter a value in the bracket represents the surface tension)), HCFC-225cb (1,3-dichloro-1,1,2,2,3-pentafluoropropane (16.7)), hexane (17.9), diethyl ether (17.3), diisopropyl ether (19.4), tert-butanol (19.4), trimethylamine (14.5), HCFC-123 (2,2-dichloro-1,1,1-trifluoroethane (15.5)), HCFC-141 b (1,1-dichloro-1-fluoroethane (15.8)), HFC-365mfc (1,1,1,3,3-pentafluorobutane (15.0)), PFPO (pentafluoropropanol (17.7)) or HFIP (hexafluoroisopropanol (16.5)).

Among them, in the present invention, in view of the workability and the safety, preferred is HCFC-225ca, HCFC-225cb, HFC-365mfc, PFPO, HFIP or a mixture of at least two of them. They may be used alone or in combination of two or more. In a case where two or more of them are used in combination, the surface tension of a mixed liquid thereof is adjusted to be within the above range.

Here, for the coating composition of the present invention, a combination of organic solvents of which the surface tension can be adjusted to be within the above range of the present invention, although each organic solvent by itself has a surface tension out of the range of the present invention, may be used.

The boiling point of the organic solvent is preferably from 5 to 210° C., more preferably from 5 to 150° C., whereby the solvent will easily be removed after the coating composition is applied to the substrate, and the aluminum pigment particles are likely to be aggregated in the coating film interior.

The content of the organic solvent in the coating composition of the present invention is preferably within a range of from 50 to 90 mass % as the content of the organic solvent to the total mass of the composition from the viewpoint of the coating workability, and is more preferably from 55 to 85 mass % to the total mass of the composition.

(5) Optional Component

In the coating composition of the present invention, various optional additives may be blended depending upon the required properties within a range not to impair the effects of the present invention. Such additives may, for example, be specifically a curing catalyst, a pigment (except for the leafing aluminum pigment), an ultraviolet absorber, a photostabilizer, a surface modifier, a pigment dispersing agent, a defoaming agent, a thickener, an adhesion-improving agent and a delustering agent.

As the curing catalyst, a known tin type or other metal type, organic acid type or amino type curing accelerator may be used. The amount of addition of the curing catalyst depends on the curing catalyst to be used and is preferably from 7 to 20 ppm, more preferably from 7 to 15 ppm per 100 parts by mass of the coating resin.

Further, the pigment (except for the leafing aluminum pigment) is preferably added depending upon the purpose of use of a coated article, with a view to obtaining a beautiful outer appearance of a coated article having a coating film formed from the obtainable coating composition of the present invention and with a view to protecting the substrate sheet on which the coating film is formed from ultraviolet light. From such viewpoints, titanium oxide which is a white pigment is particularly preferred since it has a high coloring power and has a high ultraviolet absorbing function. In addition, calcium carbonate and carbon black which is a black pigment, and a composite metal such as a Cu—Cr—Mn alloy as well are preferred. The amount of addition of the pigment depends on the pigment to be used and the purpose of application of the coated article, and is preferably from 100 to 300 parts by mass per 100 parts by mass of the coating resin.

In a case where a coating film to be formed is required to be a highly transparent clear film, such as a case where the coated article is a solar cell module, an ultraviolet absorber or a photostabilizer is added as the case required to impart an ultraviolet absorbing effect. As a typical ultraviolet absorber, a benzophenol type, a triazine type or a benzotriazole type may suitably be used. As the photostabilizer, a hindered amine type or a phosphorus type may be suitably used. The required amount of addition of the ultraviolet absorber varies depending upon the thickness of the obtainable coating film layer. Specifically, the ultraviolet absorber is added to achieve a concentration at which the ultraviolet transmittance with the thickness of the formed coating layer becomes less than 10%.

(6) Preparation of Coating Composition

The coating composition is prepared by mixing the organic solvent, the coating resin soluble or dispersible in the organic solvent and the leafing aluminum pigment which are the above-mentioned essential components, and the curing agent and various additives added as the case requires, in the above predetermined amounts and proportions.

Here, when the coating resin is supplied in the form of a solution or a dispersion in which the resin produced e.g. by polymerization is dissolved or dispersed, so long as the solvent or the dispersion medium thereof satisfies the above conditions of the organic solvent in the present invention, the solution or the dispersion may be used as it is. In such a case, the amount of the solvent or the dispersion medium in which the resin is dissolved or dispersed is adjusted so as to be included in the content as the organic solvent in the coating composition of the present invention.

Further, in a case where the solvent or the dispersion medium in which the resin to be used is dissolved or dispersed does not satisfies the above conditions of the organic solvent in the present invention, the solvent or the dispersion medium is removed and the purified resin is blended in the coating composition.

[Method for Producing Coating Film]

The method for producing the coating film of the present invention comprises a coating step (A) of applying the coating composition of the present invention to a substrate, and a drying step (B) of removing the organic solvent in the coating composition applied to obtain the coating film after the coating step (A). In a case where the coating resin to be used is a curable resin, usually in the drying step (B), curing is simultaneously carried out.

Coating Step (A):

The coating step (A) is a step of applying the coating composition to the surface of a substrate to form a coating film layer comprising the coating composition.

The coating method is properly selected depending upon the properties (particularly the viscosity and rheological properties) of the coating material from a spin coating method, a spraying method, a slit coating method, a roll coating method, a rotational coating method, a bar coating method, a dip coating method and the like. The coating temperature is within a range of conventional conditions in the above coating methods, and is approximately preferably from 5 to 35° C.

Application of the coating composition to the substrate may be directly carried out on the substrate surface or may be carried out by means of a primer layer or the like.

Formation of the primer layer is carried out by a conventional method using a known coating material for a primer. The coating material for a primer may, for example, be an epoxy resin, a urethane resin, an acrylic resin, a silicone resin or a polyester resin.

The thickness of the coating film layer comprising the coating composition formed by application of the coating composition depends on the coating composition used and the coated article for which it is to be used, and is preferably from 10 to 22 μm, more preferably from 10 to 15 μm. When the thickness of the coating film is within such a range, favorable balance of the opacifying properties, the weather resistance, the chemical resistance, the moisture resistance, the adhesion, and the self supporting properties of a film when laminated will be obtained.

Drying Step (B):

The drying step (B) is a step of removing the organic solvent from the coating film layer comprising the coating composition formed in the above coating step (A), i.e. drying the coating film to form the coating film composed mainly of the coating resin and the leafing aluminum pigment. As mentioned above, in a case where the coating resin used is the curable resin, usually, curing is simultaneously carried out in this drying step (B).

The method of removing the organic solvent may, for example, be heating or reducing the pressure, and preferred is a method by reducing the pressure, so that the removed medium will not be vaporized to form bubbles between layers or in the coating film layer. Further, it is also preferred to carry out heating and reducing the pressure simultaneously.

The heating temperature depends on the type or the amount of the organic solvent used, the type of the coating resin, or the like, and in view of the mobility of the leafing aluminum pigment in the undried state (in the case of the curable resin, the undried state is equal to the uncured state), it is preferably from 5 to 120° C., more preferably from 5 to 80° C. Further, the heating time similarly depends on the type or the amount of the organic solvent used, the type of the coating resin or the like, and in view of the mobility of the leafing aluminum pigment in the undried state, it is preferably from 1 to 180 minutes, more preferably from 2 to 20 minutes. The heating means is not particularly limited so long as the coating film comprising the coating composition is uniformly heated, and for example, a conventional heating means such as an oven, a hot plate or an infrared lamp may be used.

The condition for the above reduction in the pressure is preferably at a level of from 0.1 to 300 mmHg for example. Further, the vacuum reduction means may, for example, be a vacuum pump or an aspirator.

In the above drying step, the organic solvent is completely removed from the coating film layer comprising the coating composition, and in a case where the coating resin is a curable resin, it is completely cured simultaneously with removal of the organic solvent, whereby a coating film is formed. On that occasion, the leafing aluminum pigment particles contained in the coating composition are aggregated as overlapped in the interior of the obtainable coating film, and forms a leafing aluminum pigment layer in which they are aligned in parallel with the surface of the coating film. With respect to the position of the leafing aluminum pigment layer in the coating film, from the viewpoint of the moisture resistance and protection of the aluminum pigment, the most part is concentrated in a position of ⅛ to ⅞ from the surface relative to the thickness of the coating film finally obtainable, more preferably from ⅖ to ⅗. When the alignment layer of the leafing aluminum pigment is at such a position in the obtainable coating film, the coating film is useful as one having both sufficient moisture resistance and stability during long term use.

Further, in a case where the coating composition contains an optional component such as a pigment, an ultraviolet absorber, a photostabilizer, a surface modifier, a pigment dispersing agent, a defoaming agent, a thickener, an adhesion improving agent or a delustering agent, such a component is present as substantially uniformly dispersed in the coating film finally obtainable, differently from the leafing aluminum pigment.

The material, the shape and the like of the substrate on which the coating film is to be formed in the present invention are not particularly limited, and with a view to imparting the moisture resistance, the substrate is preferably a resin sheet.

The resin may, for example, be specifically a polyolefin such as polyethylene or polypropylene; a polyvinyl halide such as polyvinyl chloride, polyvinylidene chloride, polyvinyl fluoride or polyvinylidene fluoride; a polyester such as polyethylene terephthalate (PET) or polybutylene terephthalate; a polyamide such as nylon 6, nylon 66 or MXD nylon (m-xylenediamine/adipic acid copolymer); a polymer of an olefin having a substituent such as polyvinyl acetate, polyvinyl alcohol or polymethyl methacrylate; or a copolymer such as an ethylene/vinyl acetate copolymer (EVA), an ethylene/vinyl alcohol copolymer or an ethylene/tetrafluoroethylene copolymer.

Further, in a case where the coating film formed on the surface of the substrate by the production method of the present invention is used for a backsheet for a solar cell module for example, the substrate is not particularly limited so long as it is a sheet-form and is a sheet having mechanical properties and water impermeability, and a substrate sheet commonly used for a backsheet for a solar cell module may be used. The substrate sheet is preferably a metal thin sheet of aluminum, stainless steel or the like, a resin sheet, a metal-deposited resin sheet having a metal such as Si or aluminum deposited on at least one surface, or the like, in view of the weight, the price, the flexibility or the like, and is more preferably a resin sheet or a metal-deposited resin sheet.

The resin to be used for the backsheet for a solar cell module may be the same resin as the above resin, and among them, it is particularly preferably PET, EVA, polyvinyl alcohol, polyvinylidene chloride, nylon 6, nylon 66, an ethylene/vinyl alcohol copolymer or the like. In a case where the coating film is used for a backsheet for a solar cell module, the thickness of the substrate sheet is approximately preferably from 10 to 200 μm.

The substrate on which the coating film is formed in the present invention may be one subjected to surface treatment by a conventional method so as to improve the adhesion. The surface treatment may, for example, be a corona discharge treatment, a plasma discharge treatment or a chemical conversion treatment, or in the case of a metal sheet, blast treatment.

[Coated Article]

The coating composition of the present invention is preferably used for formation of a coating film of a coated article which is required to have the moisture resistance, the stability during long term use and the coating film strength. Such a coated article may, for example, be specifically a backsheet for a solar cell module, a protective film for an automobile, a film for a semiconductor, or light shielding film.

EXAMPLES

Now, the present invention will be described in further detail with reference to Examples. However, it should be understood that the present invention is by no means restricted to such specific Examples.

(Production of Crosslinkable Fluorinated Copolymer)

70 Parts by weight of chlorotrifluoroethylene, 10 parts by weight of cyclohexyl vinyl ether, 30 parts by weight of ethyl vinyl ether, 10 parts by weight of hydroxybutyl vinyl ether, 0.5 part by weight of potassium carbonate as a buffer, 100 parts by weight of xylene as a polymerization solvent, 30 parts by weight of ethanol, and 2 parts by weight of azobisisobutyronitrile as a polymerization initiator were charged in an autoclave and stirred at 70° C. for 15 hours, ethanol was distilled off and removed, and the remaining potassium carbonate was removed, to obtain a xylene solution of a fluorinated polymer. Then, xylene was distilled off by a tin film evaporator to obtain a crosslinkable fluorinated copolymer A (solid content: 99.6 mass %, number average molecular weight ($M_e$): 14,000, mass average molecular weight ($M_w$): 40,000, hydroxy value: 50 mgKOH/g).

Example 1

(1) Preparation of Crosslinkable Fluorinated Copolymer Coating Material

To 32.1 g of the above obtained crosslinkable fluorinated copolymer A, 5.7 g of 1-10-hexanediisocyanate trimer (CORONATE HX (tradename, manufactured by Nippon Polyurethane Industry Co., Ltd.)) as a curing agent, 0.22 mg of dibutyltin dilaurate (DBTDL) as a curing catalyst, 88.0 g of ASAHIKLIN AK-225 (tradename, manufactured by Asahi Glass Company, Limited, a mixture of HCFC-225ca and HCFC-225cb in a mass ratio of 45:55, surface tension: 16.7 mN/m (the value of the surface tension is based on "Fusso Kagaku Nyumon (fluorine chemistry primer)" (SANKYO PUBLISHING CO., LTD.)) as an organic solvent and 2.2 g of STAPA30 (tradename, manufactured by ECKART, surface tension: from 22 to 25 mN/m (the value of the surface tension is as disclosed in the homepage of Toyo Aluminum K.K.), average particle size (D50): 6 μm) as a leafing aluminum pigment were added and mixed by a stirring mixer (apparatus) to prepare a crosslinkable fluorinated copolymer coating material (1).

(2) Preparation and Evaluation of Cured Coating Film

The above obtained coating material (1) was applied to polypropylene (substrate) by an applicator coating method and left to stand at room temperature for 5 minutes, and then subjected to heat treatment at 80° C. for 60 minutes to completely remove the organic solvent and be cured to obtain a coating film (hereinafter the obtained coating film will be referred to as "cured coating film"). The obtained cured coating film was removed from the substrate by a NT cutter, and the thickness was measured by an electromagnetic film thickness meter, whereupon it was 20 μm.

The cross section of the obtained cured coating film was observed by a scanning electron microscope (5,000 magnifications), whereupon the leafing aluminum pigment particles were aggregated at a position of from 5 to 15 μm from the surface of the cured coating film and were aligned in parallel with the surface.

Further, with respect to the cured coating film, the following water vapor permeability test and accelerated weather resistance test were carried out. The result was 41[g/$m^2$·day·25 μm] with respect to the water vapor permeability test and no abnormality with respect to the accelerated weather resistance test.

[Water Vapor Permeability Test]

Calcium carbonate was uniformly put in a water vapor permeable cup (diameter) preliminarily heated at 40° C., a test specimen was fixed to the opening of the water vapor permeable cup so that the distance between calcium chloride and the test specimen became 3 mm, and the mass ($w_0$) was measured. This cup was put in a constant temperature and humidity apparatus (40° C., 90%), and one day (24 hours) later, it was taken out from the apparatus and left to stand for one hour, and then the mass was measured. The water vapor permeability was determined as the water vapor permeability at a thickness of 25 μm from the following formula:

Water vapor permeability [g/m²·day·25 μm]=($W_T$−$W_0$)/($S \times D \times T$/25)

(The symbols in the formula represent the following values. $W_T$: the mass (g) after the test, $W_0$: the mass (g) before the test, S: the sample area (m²), D: the test day (day), T: sample thickness (μm))

[Accelerated Weather Resistance Test]

Using an accelerated weather resistant test apparatus in accordance with JIS B7753, an accelerated weather resistance test for 1,000 hours was carried out, and the state of the coating film was visually observed.

The composition of the crosslinkable fluorinated copolymer coating material in Example 1 and the coating film physi-

Comparative Example 2

A crosslinkable fluorinated copolymer coating material (3) was prepared in the same manner as in Example 1 except that instead of STAPA 40, non-leafing aluminum pigment STAPA METALLUX 2197 (tradename, manufactured by ECKART, surface tension: about 500 mN/m (the surface tension of aluminum as it is), average particle size (D50): 9 μm) was used. Using the obtained coating material (3), a cured coating film was formed in the same manner as in Example 1, and coating film physical properties were evaluated in the same manner as in Example 1. The composition of the coating material and the evaluation results are shown in Table 1.

TABLE 1

|  |  |  | Example | Comparative Example | |
|---|---|---|---|---|---|
|  |  |  | 1 | 1 | 2 |
| Composition of coating composition | Crosslinkable fluorinated copolymer | Type | A | A | A |
|  |  | Amount (g) | 32.1 | 32.1 | 32.1 |
|  |  | True amount (g) of copolymer | 32 | 32 | 32 |
|  | Curing agent | Type | CORONATE HX | CORONATE HX | CORONATE HX |
|  |  | Amount (g) | 5.7 | 5.7 | 5.7 |
|  | Total amount (mass %) of fluorinated copolymer, curing agent and aluminum pigment in composition |  | 31.2 | 31.2 | 31.2 |
|  | Organic solvent | Type | AK225 | Industrial xylene | AK225 |
|  |  | Amount (g) | 88.0 | 88.0 | 88.0 |
|  |  | Amount (g) in composition | 68.7 | 68.7 | 68.7 |
|  |  | Surface tension (mN/m) | 16.7 | 27.8 to 29.5 | 16.7 |
|  | Leafing aluminum pigment (STAPA30) | Amount (g) | 2.2 | 2.2 | — |
|  |  | Surface tension (mN/m) | 22 to 25 | 22 to 25 | — |
|  | Non-leafing aluminum pigment (STAPA METALLUX 2197) | Amount (g) | — | — | 2.2 |
|  |  | Surface tension (mN/m) | — | — | 500 |
|  | Amount (parts by mass) of aluminum pigment per 100 parts by mass of fluorinated copolymer and curing agent in total |  | 5.8 | 5.8 | 5.8 |
|  | Curing catalyst | Type | DBTDL | DBTDL | DBTDL |
|  |  | Amount (mg) | 0.22 | 0.22 | 0.22 |
|  |  | Amount (ppm) per 100 parts by mass of curable resin | 5.8 | 5.8 | 5.8 |
| Physical properties of coating film | Thickness (μm) |  | 20 | 36 | 54 |
|  | Position of layer having aluminum pigment particles aggregated (distance from coating film surface: μm) |  | 5 to 15 | 0 to 8 | Entirely dispersed |
|  | Water vapor permeability [g/m²/day/25 μm] |  | 41 | 59 | 76 |
|  | Accelerated weather resistance (SWOM1000h) |  | No abnormality | Whitened | No abnormality | cal properties (the thickness, the position of the layer having the leafing aluminum pigment particles aggregated in the coating film, and the results of the water vapor permeability test and the accelerated weather resistance test) are shown in Table 1.

Comparative Example 1

A crosslinkable fluorinated copolymer coating material (2) was prepared in the same manner as in Example 1 except that instead of AK225, industrial xylene (a mixture of xylene isomer and ethylbenzene, surface tension: 27.8 to 29.5 mN/m (the value of the surface tension is based on "Yozai Handbook (Solvent Handbook)" (Kodansha Ltd.)) was used. Using the obtained coating material (2), a cured coating film was formed in the same manner as in Example 1, and the coating film physical properties were evaluated in the same manner as in Example 1. The composition of the coating material and the evaluation results are shown in Table 1.

INDUSTRIAL APPLICABILITY

According to the coating composition of the present invention, formation of a coating film having moisture resistance, and stability during long term use and coating film strength as well, can be formed by a single application even with a small amount of the aluminum pigment blended, and the coating composition is widely applicable to an article for which such formation of a coating film is required, for example, a backsheet for a solar cell, a protective film for an automobile, a film for a semiconductor, and a light shielding film.

What is claimed is:

1. A coating composition comprising:
an organic solvent;
a coating resin soluble or dispersible in the organic solvent, wherein the coating resin comprises a curable resin; and
a leafing aluminum pigment;
wherein:
the surface tension of the organic solvent at 20° C. is from 10 to 22 mN/m, the surface tension of the leafing aluminum pigment at 20° C. is from 20 to 30 mN/m, the leafing aluminum pigment is present in an amount of 5 to 25 parts by mass per 100 parts by mass of the coating resin, the organic solvent is present in an amount of 50 to 90 mass % based on a total mass of the coating composition, and a coating film produced from the coating composition has a water vapor permeability of 41 g/m$^2$/day/25 μm or less.

2. The coating composition of claim 1, further comprising a curing agent.

3. The coating composition of claim 2, wherein the leafing aluminum pigment is present in an amount of 5 to 25 parts by mass per 100 parts by mass of a total amount of the coating resin and the curing agent.

4. The coating composition of claim 1, wherein the coating resin is a fluororesin.

5. The coating composition of claim 1, further comprising at least one member selected from the group consisting of a curing catalyst, an ultraviolet absorber and a pigment different from the leafing aluminum pigment.

6. The coating composition of claim 1, wherein the coating resin is a fluorinated copolymer having crosslinkable groups.

7. The coating composition of claim 1, wherein the coating resin is a chlorotrifluoroethylene/hydroxyalkyl vinyl ether copolymer, a chlorotrifluoroethylene/hydroxyalkyl vinyl ether/alkyl vinyl ether copolymer, or a chlorotrifluoroethylene/hydroxyalkyl vinyl ether/vinyl carboxylate copolymer.

8. The coating composition of claim 1, wherein the organic solvent is at least one member selected from the group consisting of 3,3-dichloro-1,1,1,2,2-pentafluoropropane, 1,3-dichloro-1,1,2,2,3-pentafluoropropane, 1,1,1,3,3-pentafluorobutane, pentafluoropropanol, and hexafluoroisopropanol.

9. A method for producing a coating film, which comprises applying the coating composition of claim 1 to a substrate, and removing the organic solvent from the coating composition.

10. The method of claim 9, wherein the substrate is a resin sheet.

11. The method of claim 9, wherein a layer having the leafing aluminum pigment aggregated is formed in the interior of the coating film.

* * * * *